United States Patent [19]

(12) United States Patent
Boroson et al.

(10) Patent No.: US 7,057,339 B2
(45) Date of Patent: Jun. 6, 2006

(54) OLED WITH COLOR CHANGE MEDIA

(75) Inventors: Michael L. Boroson, Rochester, NY (US); Dustin L. Winters, Webster, NY (US); Yuan-Sheng Tyan, Webster, NY (US); Keith B. Kahen, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/820,570

(22) Filed: Apr. 8, 2004

(65) Prior Publication Data

US 2005/0225233 A1    Oct. 13, 2005

(51) Int. Cl.
*H01J 1/62*    (2006.01)
(52) U.S. Cl. .................... 313/504; 313/110
(58) Field of Classification Search ........ 313/495–506, 313/110–113; 428/690, 917
See application file for complete search history.

(56) References Cited

U.S. PATENT DOCUMENTS

| | | | |
|---|---|---|---|
| 4,356,429 A | 10/1982 | Tang | |
| 4,769,292 A | 9/1988 | Tang et al. | |
| 4,885,211 A | 12/1989 | Tang et al. | |
| 5,276,380 A | 1/1994 | Tang | |
| 5,550,066 A | 8/1996 | Tang et al. | |
| 5,554,911 A * | 9/1996 | Nakayama et al. | 313/504 |
| 5,780,174 A * | 7/1998 | Tokito et al. | 428/690 |
| 5,909,081 A * | 6/1999 | Eida et al. | 313/504 |
| 6,259,423 B1 * | 7/2001 | Tokito et al. | 345/76 |
| 6,281,634 B1 * | 8/2001 | Yokoyama | 315/169.3 |
| 6,309,486 B1 * | 10/2001 | Kawaguchi et al. | 156/67 |
| 6,366,017 B1 | 4/2002 | Antoniadis et al. | |
| 6,406,801 B1 * | 6/2002 | Tokito et al. | 428/690 |
| 6,456,013 B1 | 9/2002 | Komiya et al. | |
| 6,608,439 B1 * | 8/2003 | Sokolik et al. | 313/512 |
| 6,653,778 B1 * | 11/2003 | Tomiuchi et al. | 313/501 |
| 6,841,803 B1 * | 1/2005 | Aizawa et al. | 257/98 |
| 6,873,093 B1 * | 3/2005 | Yu et al. | 313/112 |

FOREIGN PATENT DOCUMENTS

| | | |
|---|---|---|
| EP | 1124261 | 8/2001 |
| EP | 1124274 | 8/2001 |
| EP | 1441571 | 7/2004 |
| JP | 11-288786 | 10/1999 |
| WO | 03/039203 | 5/2003 |

OTHER PUBLICATIONS

N. Takada, T. Tsutsui, and S. Saito, Appl. Phys. Lett. 63 (15) 2032 (1993), "Control of emission characteristics in organic thin film electroluminescent diodes using an optical microcavity structure".

* cited by examiner

*Primary Examiner*—Joseph Williams
*Assistant Examiner*—Dalei Dong
(74) *Attorney, Agent, or Firm*—Raymond L. Owens

(57) ABSTRACT

A tuned OLED device includes a microcavity structure including a light-emitting layer for producing light, a semi-transparent reflector, and a reflector layer disposed on opposite sides of the light-emitting layer, the microcavity structure enhancing on-axis light produced from the light-emitting layer in at least one particular wavelength to produce a desired on-axis viewed color while not substantially enhancing on-axis other wavelengths of such light; and a layer including a color change medium which is responsive to wavelengths of light shorter than the particular wavelength by absorbing such shorter wavelengths of light and emitting light corresponding in color to the particular wavelength, thereby improving the color of the light produced by the OLED device when viewed in an off-axis direction.

25 Claims, 3 Drawing Sheets

OLED WITH COLOR CHANGE MEDIA

CROSS REFERENCE TO RELATED APPLICATIONS

Reference is made to commonly assigned U.S. patent application Ser. No. 10/819,697 filed Apr. 8, 2004 by Michael L. Boroson et al., entitled "Color OLED With Added Color Gamut Pixels", the disclosure of which is herein incorporated by reference.

FIELD OF THE INVENTION

The present invention relates to organic electroluminescent (EL) devices. More specifically, this invention relates to an emitting EL device with improved efficiency, color purity, and viewing angle.

BACKGROUND OF THE INVENTION

Full color organic electroluminescent (EL), also known as organic light-emitting devices (OLED), have been demonstrated recently as a new type of flat panel display. OLED devices are attractive because of their low driving voltage, high luminance, wide-angle viewing and capability for full color flat emission displays. In simplest form, an organic EL device is comprised of an anode for hole injection, a cathode for electron injection, and an organic EL medium sandwiched between these electrodes to support charge recombination that yields emission of light. An example of an organic EL device is described in commonly assigned U.S. Pat. No. 4,356,429. Other examples have been described by Tang et al. in U.S. Pat. Nos. 4,769,292 and 4,885,211. In order to construct a pixilated display device that is useful, for example as a television, computer monitor, cell phone display or digital camera display, individual organic EL elements can be arranged as an array of pixels in a matrix pattern. This matrix of pixels can be electrically driven using either a simple passive matrix or an active matrix driving scheme. In a passive matrix, the organic EL layers are sandwiched between two sets of orthogonal electrodes arranged in rows and columns. An example of a passive matrix-driven organic EL device is disclosed in commonly assigned U.S. Pat. No. 5,276,380. In an active matrix configuration, each pixel is driven by multiple circuit elements such as transistors, capacitors, and signal lines. Examples of such active matrix organic EL devices are provided in U.S. Pat. Nos. 5,550,066 (commonly assigned), 6,281,634, and 6,456,013.

One way of improving the efficiency of an OLED device is the use of a microcavity structure. A reflector and a semitransparent reflector function, with the layers between them, form a microcavity, which can be adjusted in thickness and refractive index to resonate at a desired wavelength. Examples of microcavity structures are shown in U.S. Pat. No. 6,406,801, U.S. patent application Publication No. 5,780,174, and JP 11-288786.

Destructive light interference can result from microcavity effects within an OLED device and can cause color distortion when the OLED is viewed from oblique angles. Microcavity devices are characteristically directional; the emission intensity falls rapidly with viewing angle, e.g. N. Takada, T. Tsutsui, and S. Saito, Appl. Phys. Lett. 63 (15) 2032 (1993), "Control of emission characteristics in organic thin film electroluminescent diodes using an optical microcavity structure".

SUMMARY OF THE INVENTION

It is therefore an object of the present invention to provide an OLED device with reduced color when viewed in an off-axis direction.

This object is achieved by a tuned OLED device, comprising:

a) a microcavity structure including a light-emitting layer for producing light, a semitransparent reflector, and a reflector layer disposed on opposite sides of the light-emitting layer, the microcavity structure enhancing on-axis light produced from the light-emitting layer in at least one particular wavelength to produce a desired on-axis viewed color while not substantially enhancing on-axis other wavelengths of such light; and b) a layer including a color change medium which is responsive to wavelengths of light shorter than the particular wavelength by absorbing such shorter wavelengths of light and emitting light corresponding in color to the particular wavelength, thereby improving the color of the light produced by the OLED device when viewed in an off-axis direction.

Advantages

It is an advantage of this invention that it provides an efficient OLED device with reduced color distortion when viewed at an angle off-axis. It is a further advantage of the present invention that it can provide improved luminance in some embodiments, especially when viewed at an off-axis angle.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors can be produced by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. However, it is recognized that in full color systems, several pixels of different colors will be used together to produce a broad range of colors, and a viewer can term such a group a single pixel. For the purposes of this invention, such a logical grouping will be termed a group of pixels or a pixel group. In a full color display, a group of pixels generally comprises three primary-color pixels, namely red, green, and blue (RGB), which are color-gamut-defining pixels. It is well known that microcavity structures can enhance emission of a relatively narrow range of wavelengths of light, and the term "particular wavelength" will be used to describe such an enhanced range of wavelengths.

Figure 1:
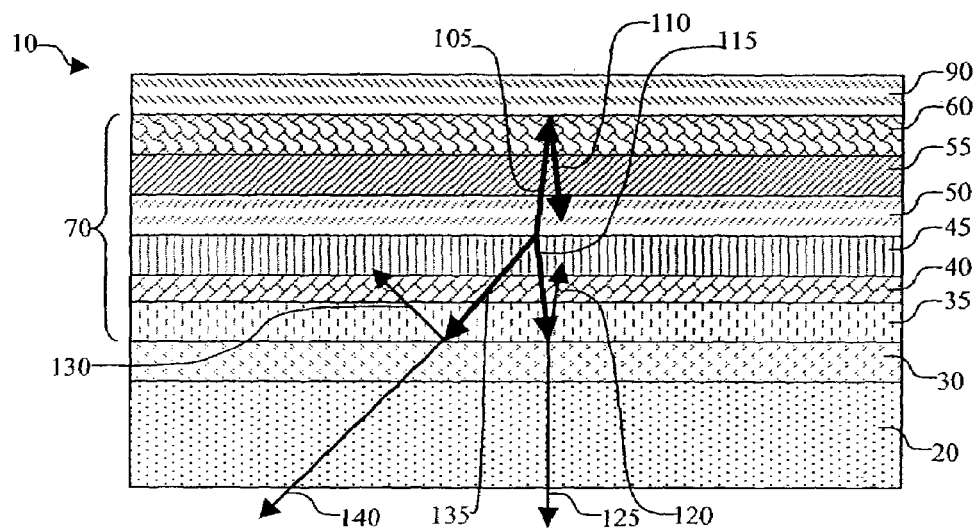
FIG. 1 shows a cross-sectional view of a prior art microcavity OLED device showing the effect of light emission in a microcavity.

FIG. 1 is a cross-sectional view of a prior art tuned OLED device 10 showing the effect of light emission in a microcavity. Microcavity OLED devices have been reported to achieve improved chromaticity and emission efficiency. Although tuned OLED device 10 is shown as emitting light from the bottom (that is, a bottom-emitting device), it will be understood that tuned OLED device 10 can be a top-emitting device.

Tuned OLED device 10 comprises a microcavity structure 70 and includes reflector layer 90, which is a material that is highly reflective at the wavelengths at which tuned OLED device 10 emits light. Preferred materials for reflector layer 90 that are highly reflective include Ag, Al, Au, or alloys composed of one or more of these materials. Tuned OLED device 10 also includes semitransparent reflector 30, which is partially reflective and partially transmissive. Suitable materials for semitransparent reflector 30 include Ag, Au, or alloys composed of one or both of these materials, in a thickness selected to cause them to be semitransparent, that is, partially transmitting and partially reflective. This thickness can be in the range of, for example, between 5 nm and 50 nm, and is more preferably between 15 nm and 30 nm. An alternate semitransparent reflector structure composed of a quarter wave stack (QWS) of transparent materials with alternating high and low refractive indexes is also known and can be applied to the present invention by someone skilled in the art. Reflector layer 90 and semitransparent reflector 30 are disposed on opposite sides of light-emitting layer 50, which functions to produce light. In a bottom-emitting device, such as shown, where the light is viewed through substrate 20, semitransparent reflector 30 is located between light-emitting layer 50 and substrate 20, and reflector 90 is located above substrate 20, semitransparent reflector 30, and light-emitting layer 50. Alternately, in a top-emitting device, that is where the light is viewed in the direction opposite substrate 20, reflector layer 90 is located between light-emitting layer 50 and substrate 20, and semitransparent reflector 30 is located above substrate 20, reflector layer 90, and light-emitting layer 50.

Reflector layer 90 and semitransparent reflector 30 function, with the layers between them, to form a microcavity structure 70, which can be adjusted in thickness and refractive index to resonate at a desired wavelength. Examples of microcavity structures are shown in U.S. Pat. No. 6,406,801, U.S. patent application Publication No. 5,780,174 A1, and JP 11288786. A transparent cavity-spacer layer 35 can be used as an additional means to adjust the microcavity structure resonance wavelength. Light is shown as being emitted at the interface of hole-transporting layer 45 and light-emitting layer 50. Light 115 is on-axis light that is produced from light-emitting layer 50 in the direction of semitransparent reflector 30 and is partially reflected as partially reflected light 120, and partially transmitted as partially transmitted on-axis light 125. Partially transmitted on-axis light 125 includes one or more narrow wavelength bands of light. That is, microcavity structure 70 enhances on-axis light produced from light-emitting layer 50 in at least one particular wavelength of on-axis light to produce a desired on-axis viewed color while not substantially enhancing other wavelengths of such light. Light 105 represents on-axis light that is emitted in the direction of reflector layer 90 and is reflected as reflected light 110. It will be partially reflected and partially transmitted at semitransparent reflector 30.

The thickness of microcavity structure 70 including transparent cavity-spacer layer 35 (if present) is selected to tune the microcavity OLED device 10 to have the resonance at the predetermined wavelength to be emitted from the device. The thickness satisfies the following equation:

$$2\Sigma n_i L_i + 2n_s L_s + (Q_{m1} + Q_{m2})\lambda/2\pi = m\lambda \qquad \text{Eq. 1}$$

wherein:

$n_i$ is the refractive index and $L_i$ is the thickness of the nth sub-layer in microcavity structure 70;

$n_s$ is the refractive index and $L_s$ is the thickness, which can be zero, of the transparent cavity-spacer layer 35;

$Q_{m1}$ and $Q_{m2}$ are the phase shifts in radians at the two organic EL element-reflector interfaces, respectively; and $\lambda$ is the predetermined wavelength of on-axis light to be enhanced by microcavity structure 70, and m is a non-negative integer. For example, one can select the microcavity effect to enhance on-axis the emission of green light (as partially transmitted on-axis light 125) for a desired on-axis viewed color.

Light 135 represents light that is produced in an off-axis direction. It can be partially reflected by semitransparent reflector 30 as partially reflected light 130, and partially transmitted as partially transmitted off-axis light 140. Light emitted in an off-axis direction by a microcavity structure, e.g. partially transmitted off-axis light 140, will have a different wavelength and luminance than light emitted on-axis, e.g. partially transmitted on-axis light 125. In other words, microcavity structure 70 will produce light having a broad spectrum, which can be seen at different viewing angles, even if the microcavity is tuned to enhance a single wavelength of on-axis viewed color. Typically, microcavity light emitted off-axis will have a shorter wavelength than light emitted on-axis.

Figure 2:
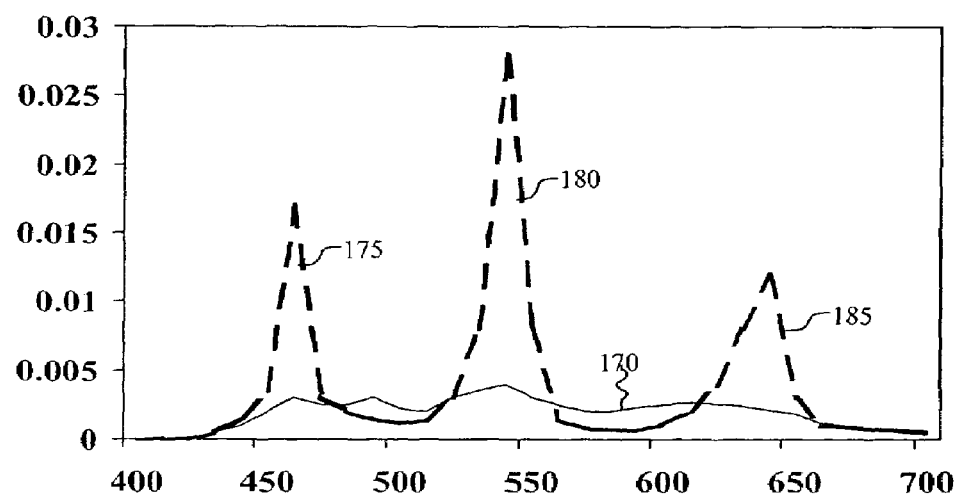
FIG. 2 shows a prior art spectrum of emission after microcavity enhancement vs. a non-enhanced white-emitting OLED device.

Turning now to FIG. 2, there is shown a spectrum of on-axis emission after multimode microcavity enhancement vs. a non-enhanced white-light-emitting OLED device. Spectrum 170 is an emission spectrum for a white-light-emitting OLED device without on-axis microcavity enhancement. The use of a multimode microcavity such as that described by Xu et al. in U.S. Pat. No. 6,133,692 will enhance certain wavelengths of the spectrum, e.g. particular wavelengths 175, 180, and 185 when the microcavity is viewed on-axis. By selecting the thickness of microcavity structure 70, one can form a microcavity structure that enhances on-axis a single narrow band of wavelengths of light.

Figure 3:
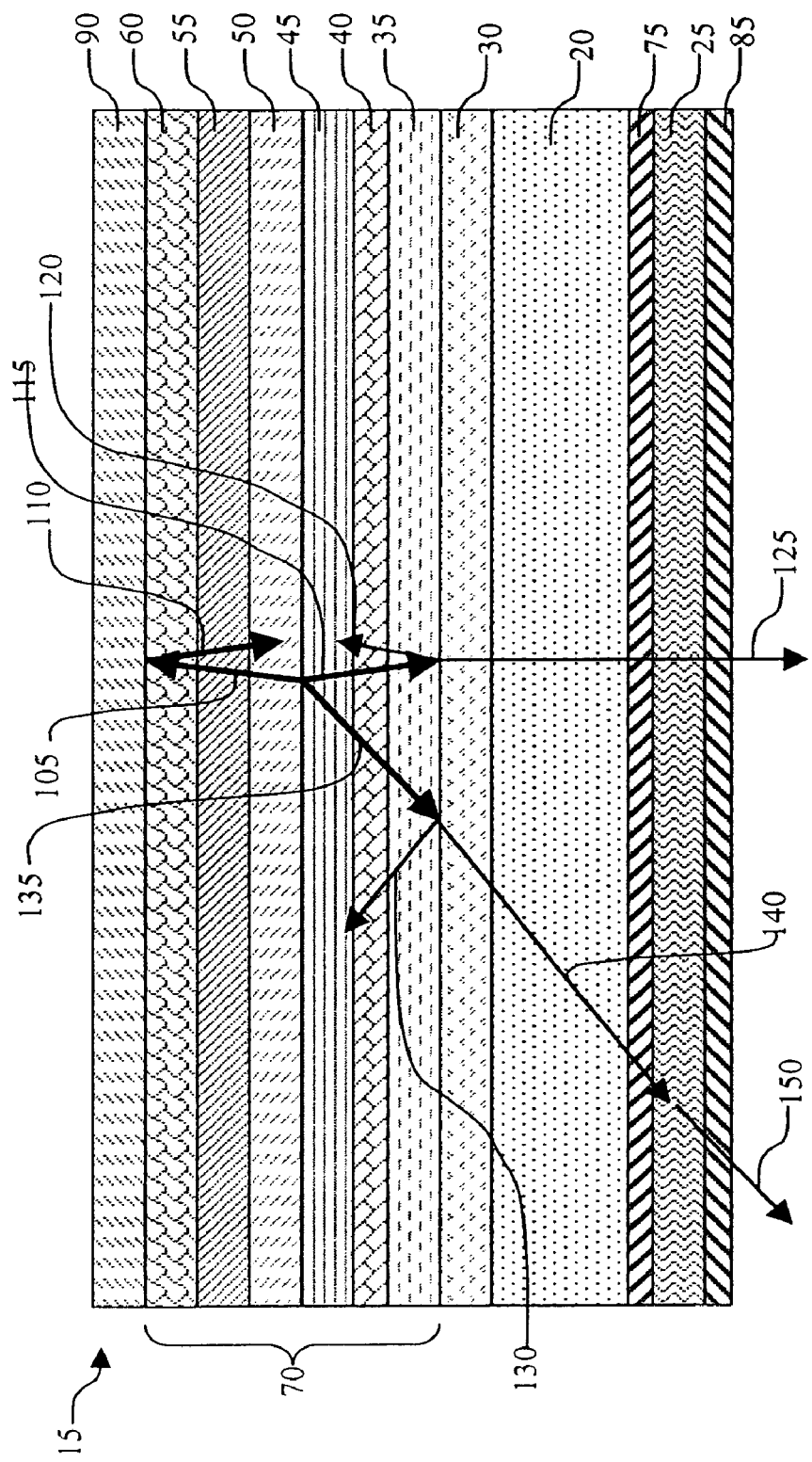
FIG. 3 shows a cross-sectional view of one embodiment of an OLED device according to the present invention.

Turning now to FIG. 3, there is shown a cross-sectional view of one embodiment of an OLED device according to the present invention. Tuned OLED device 15 can be part of a passive matrix device or an active matrix device. Tuned OLED device 15 has as its basic structure the microcavity structure 70 from tuned OLED device 10. Tuned OLED device 15 includes reflector layer 90 and semitransparent reflector 30 as described above. Reflector layer 90 and semitransparent reflector 30 function as electrodes, but other embodiments are possible wherein the reflectors and the electrodes are separate entities. The bottom electrode, i.e. the one closest to substrate 20, is most commonly configured as the anode, but this invention is not limited to devices of that configuration. Tuned OLED device 15 further includes a layer including color change medium 25. The color change medium layer is disposed over semitransparent reflector 30. Color change medium 25 is responsive to wavelengths of light shorter than the particular wavelength of on-axis light. Color change medium 25 absorbs such shorter wavelengths (e.g. partially transmitted off-axis light 140) and emits light (e.g. converted light 150) corresponding in color to the particular wavelength of partially transmitted on-axis light 125. By corresponding in color, it is meant that it is in the same region of the visible spectrum and will be perceived by a viewer as similar or the same in color. For example, the particular wavelength of on-axis light of tuned OLED device 15 can be in the green portion of the spectrum. Partially transmitted on-axis light 125 will include a narrow distribution of wavelengths that will be perceived by a viewer as green. Partially transmitted off-axis light 140 will be more blue than partially transmitted on-axis light 125, but will be absorbed by color change medium 25 and re-emitted as converted light 150. Converted light 150 can include a broader distribution of wavelengths than partially transmitted light 125, but will be in the same general portion of the visible spectrum as partially transmitted light 125 and will also be perceived by a viewer as green light. This improves the color of light produced by OLED device 15 when viewed in an off-axis direction. Similarly, the particular wavelength of on-axis light of tuned OLED device 15 can be in the blue portion of the spectrum or in the red portion of the spectrum. The properties of color change medium 25 will depend on the color of tuned OLED device 15.

Color change medium layers have been described in, e.g. U.S. Pat. No. 6,084,347 and U.S. Patent Application Publication 2003/0127968 A1, and can include, e.g. a fluorescent dye with a binder resin, or only a fluorescent dye, which comprises the color change medium. The fluorescent dye will absorb light in one region of the spectrum and emit light with a longer wavelength. Examples of fluorescent dyes for absorbing light in the near-ultraviolet to violet range and emitting blue light include stilbene-based dyes such as 1,4-bis(2-methylstyryl)-benzene and trans-4,4'-diphenylstilbene, and coumarin-based dyes such as 7-hydroxy-4-methylcoumarin, or combinations thereof. Examples of fluorescent dyes for absorbing light in the blue to bluish green region and emitting green light include coumarin dyes such as 2,3,5,6-1H,4H-tetrahydro-8-trifluoromethyl-quinolidino (9,9a,1-gh)coumarin, 3-(2'-benzothiazolyl)-7-diethylaminocoumarin, 3-(2'-benzimidazolyl)-7-N,N-diethylaminocoumarin, and naphthalimide dyes such as Basic Yellow 51, Solvent Yellow 11 and Solvent Yellow 116, or combinations thereof. Examples of fluorescent dyes for absorbing light in the blue to green region and emitting orange to red light include cyanine-based dyes such as 4-dicyanomethylene-2-methyl-6-(p-dimethylaminostyryl-4H-pyran, pyridine-based dyes such as 1-ethyl-2-(4-(p-dimethylaminophenyl)-1,3-butadienyl)-pyridinium perchlorate, and rhodamine-based dyes such as Rhodamine B and Rhodamine 6G, oxazine-based dyes, or combinations thereof. Various dyes (such as direct dyes, acid dyes, basic dyes, and disperse dyes) can be used if they have fluorescence. A fluorescent dye can be mixed into a pigment resin such as polymethacrylic acid ester, polyvinyl chloride, vinyl chloride/vinyl acetate copolymer, alkyd resin, aromatic sulfonamide resin, urea resin, melamine resin, benzoguanamine resin, or the like to help form the color change medium layer.

Color change medium 25 will emit light in all directions, including back into tuned OLED device 15. To prevent this, dielectric stack 75 can optionally be disposed between color change medium 25 layer and semitransparent reflector 30. Dielectric stack 75 will reflect light so that a greater portion of converted light 150 emitted by color change medium 25 will be directed toward the viewer. Dielectric stack 75 (also known as a quarter-wave stack) comprises alternating layers of high- and low-refractive-index materials, e.g. $SiO_2$ and $TiO_2$. Dielectric stack 75 is constructed so as to reflect a significant portion of the wavelengths in converted light 150, but must be relatively transparent to the particular wavelength of partially transmitted on-axis light 125. The art of making dielectric stacks with the desired properties is well known, e.g. Born and Wolf, "Principles of Optics," 6th ed., Pergamon Press, 1980.

While not required, tuned OLED device 15 can further include color filter 85. Color filter 85 can be any well known filter and is designed to remove any light of a shorter wavelength than the particular wavelength of on-axis light that was not absorbed by color change medium 25 or any light of a longer wavelength than the particular wavelength of on-axis light.

The tuned OLED device 15 of this invention and any pixels therein are typically disposed as shown over a supporting substrate 20. Substrate 20 can either be light transmissive or opaque, depending on the intended direction of light emission. The light transmissive property is desirable for viewing the EL emission through substrate 20, that is, a bottom-emitting device as shown. Transparent glass or plastic is commonly employed in such cases. For applications where the device is top-emitting, the transmissive characteristic of substrate 20 is immaterial, and therefore can be light transmissive, light absorbing or light reflective. Substrates for use in this case include, but are not limited to, glass, plastic, semiconductor materials, silicon, ceramics, and circuit board materials.

Microcavity structure 70 can include transparent cavity-spacer layer 35, which can be disposed between one of the reflectors and light-emitting layer 50. It must be transparent to the emitted light and as shown it must to be conductive to carry the charge between the electrode (which is the reflector) and the light-emitting layer 50. Since only through-film conductance is important, a bulk resistivity of less than about $10^8$ ohm-cm is adequate. Many metal oxides such as, but not limited to, indium-tin oxide (ITO), zinc-tin oxide (ZTO), tin-oxide (SnOx), indium oxide (InOx), molybdenum oxide (MoOx), tellurium oxide (TeOx), antimony oxide (SbOx), indium-zinc oxide (IZO), and zinc oxide (ZnOx), can be used. If transparent cavity-spacer layer 35 is not conductive, a transparent electrode can be formed above transparent cavity-spacer layer 35 in a way in which the transparent electrode would be in electrical contact with the circuitry. The transparent electrode can be constructed of a metal oxide as described above. The thickness of transparent cavity-spacer layer 35, refractive index of transparent cavity-spacer layer 35, or both, are adjusted in conjunction with the thickness and refractive index of the layers of tuned OLED device 15 to tune microcavity structure 70 to the desired color.

Tuned OLED device 15 further includes organic layers. There are numerous configurations of the organic layers known in the art wherein the present invention can be successfully practiced, including hole-injecting layer 40, hole-transporting layer 45, light-emitting layer 50, electron-transporting layer 55, and electron-injecting layer 60.

While not always necessary, it is often useful to provide a hole-injecting layer 40. Hole-injecting layer 40 can serve to improve the film formation property of subsequent organic layers and to facilitate hole injection into hole-transporting layer 45. Suitable materials for use in hole-injecting layer 40 include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, and some aromatic amines, for example, m-MTDATA (4,4',4"-tris[(3-methylphenyl)phenylamino]triphenylamine). Alternative hole-injecting materials for organic EL devices are described in EP 0 891 121 A1 and EP 1 029 909 A1.

Hole-transporting layer 45 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active-hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Hole-transporting layer 45 can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1":4",1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis {N-phenyl-N-[4-(1-naphthyl)-phenyl]amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, light-emitting layer 50 includes a luminescent or fluorescent material where electroluminescence is produced as a result of electron-hole pair recombination in this region, producing light. Light-emitting layer 50 can be comprised of a single material, but more commonly includes of a host material doped with a guest compound or compounds where light emission comes primarily from the dopant and can be of any color. The host materials in light-emitting layer 50 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g. poly(p-phenylenevinylene), PPV, can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential, which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material. For phosphorescent emitters it is also important that the host triplet energy level be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)];
CO-2: Magnesium bisoxine [alias, bis(8-quinolinolato) magnesium(II)];
CO-3: Bis[benzo {f}-8-quinolinolato]zinc(II);
CO-4: Bis(2-methyl-8-quinolinolato)aluminum(III)-μ-oxo-bis(2-methyl-8-quinolinolato)aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other classes of useful host materials include, but are not limited to, derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl) methane compounds, and carbostyryl compounds.

Preferred thin film-forming materials for use in forming electron-transporting layer 55 of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

An electron-injecting layer 60 can also be present between the cathode and the electron-transporting layer. Examples of electron-injecting materials include alkaline or alkaline earth metals, alkali halide salts, such as LiF mentioned above, or alkaline or alkaline earth metal doped organic layers.

In some instances, light-emitting layer 50 and electron-transporting layer 55 can optionally be replaced by a single layer that serves the function of supporting both light emission and electron transportation. It is also known in the art that emitting dopants can be added to the hole-transporting layer 45, which can serve as a host. Multiple dopants can be added to one or more layers in order to produce a white-emitting OLED, for example, by combining blue- and yellow-emitting materials, cyan- and red-emitting materials, or red-, green-, and blue-emitting materials. White-emitting devices are described, for example, in EP 1 187 235; U.S. Patent Application Publication 2002/0025419 A1; EP 1 182 244; U.S. Pat. Nos. 5,683,823; 5,503,910; 5,405,709; and 5,283,182. As shown in commonly assigned EP 1 187 235 A2, a white-emitting organic EL media can be achieved by the inclusion of the following layers: a hole-injecting layer 40; a hole-transporting layer 45 that is disposed over hole-injecting layer 40 and is doped with a rubrene compound for emitting light in the yellow region of the spectrum; a light-emitting layer 50 doped with a blue-light-emitting compound disposed over hole-transporting layer 45; and an electron-transporting layer 55 disposed over light-emitting layer 50. Alternate embodiments where one or more different materials are used in the organic layers for different pixels can also be applied to the present invention. These techniques can be applied to tuned OLED device 15 so that light-emitting layer 50 produces white light, also called broadband wavelength light.

Additional layers such as electron- or hole-blocking layers as taught in the art can be employed in devices of this invention. Hole-blocking layers are commonly used to improve efficiency of phosphorescent emitter devices, for example, as in U.S. Patent Application Publication 2002/0015859 A1.

The organic materials above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially defined thermal dye transfer from a donor sheet (U.S. Pat. Nos. 5,688,551; 5,851,709; and 6,066,357), and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well known optical effects in order to enhance their properties if desired. This includes, but is not limited to, optimizing layer thicknesses to yield maximum light transmission, providing dielectric mirror structures, providing anti-glare or anti-reflection coatings over the display, providing a polarizing medium over the display, or providing colored, neutral density, or color conversion filters over the display.

Figure 4:
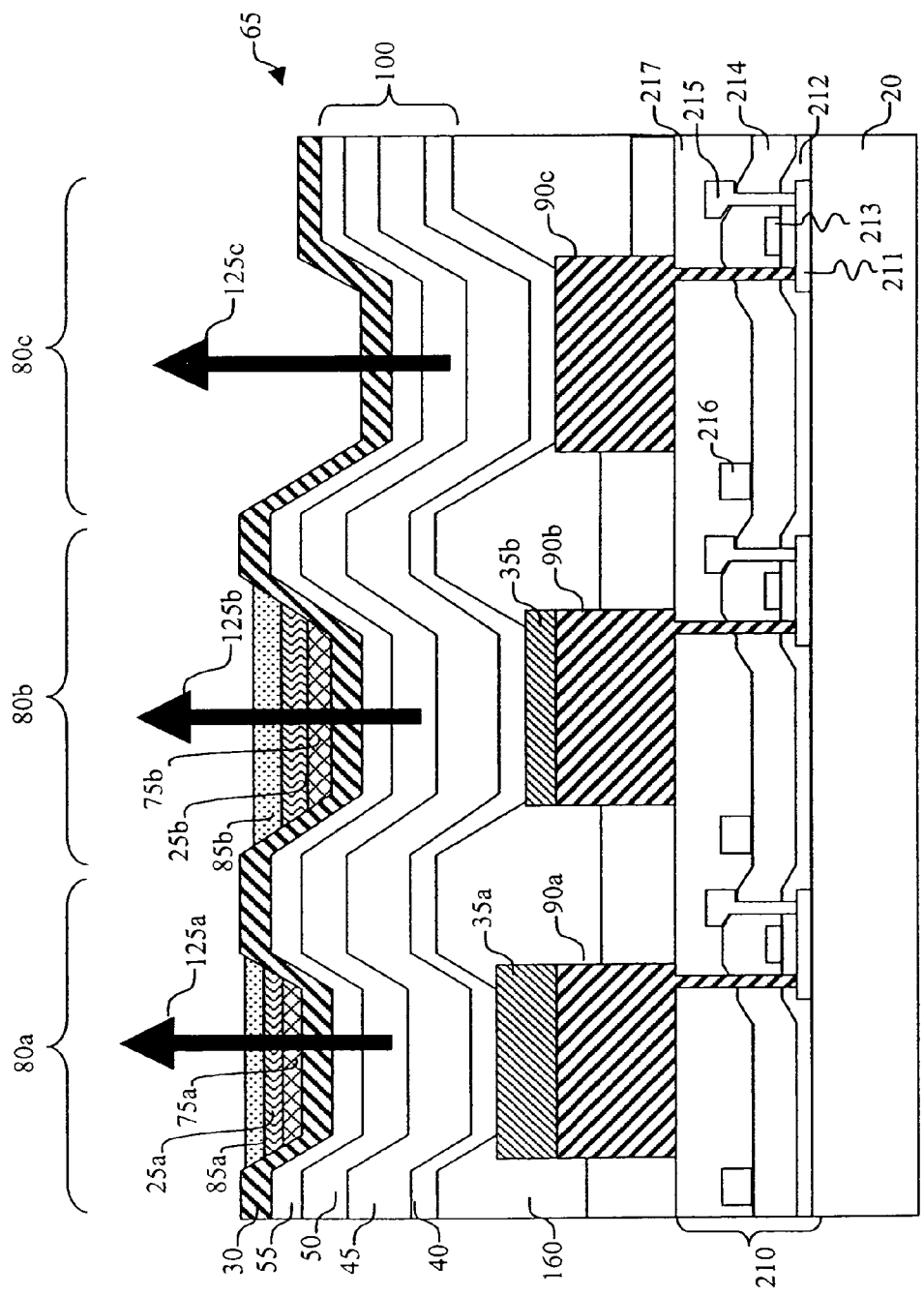
FIG. 4 shows a cross-sectional view of another embodiment of an OLED device according to the present invention.

FIG. 4 shows a cross-sectional view of a tuned multicolor OLED device having an array of different color light-emitting pixels according to another embodiment of the present invention. Tuned multicolor OLED device 65 is top-emitting, that is, light (125a, 125b, and 125c) is emitted in the direction away from substrate 20, but a bottom-emitting device can be prepared in this way as well. At least two of the different color pixels (e.g. pixels 80a, 80b) include a microcavity structure and a layer including a color change medium (e.g. color change media 25a, 25b). Each pixel that includes a microcavity structure includes a reflector layer over substrate 20 (e.g. reflector layer 90a in pixel 80a), which functions to form the bottom of a microcavity structure. Semitransparent reflector 30 forms the top of the microcavity structure for all pixels. This permits a portion of light to be emitted from the top of tuned multicolor OLED device 65. Reflector layer 90a and semitransparent reflector 30 also function as electrodes, reflector layer 90a for pixel 80a and semitransparent reflector 30 for pixels 80a, 80b, and 80c, but other configurations are possible wherein the reflector is a common electrode for all pixels and there is a separate semitransparent reflector for each pixel. Still other embodiments can be envisioned wherein the reflectors and the electrodes are separate entities.

Various embodiments of the different color pixels are possible. One useful combination is wherein tuned OLED device 65 is a full color device and the particular wavelength of on-axis light 125a is in the red portion of the spectrum, that of on-axis light 125b is in the green portion of the spectrum, and that of on-axis light 125c is in the blue portion of the spectrum. As shown, tuned OLED device 65 includes a common light-emitting layer 50 for the microcavity structure for each of the different color pixels that have a microcavity structure. This is advantageous in manufacturing as it does not require patterning of organic layers 100. Light-emitting layer 50, possibly in conjunction with other layers as described above, will most likely be constructed to produce white or broadband wavelength light in such a structure, and the differentiation of pixel color will then be a result of the effects of the microcavity, a color filter, or both. Other embodiments are well known wherein one or more of the OLED layers, such as light-emitting layer 50, can be separately patterned for one or more of pixels 80a, 80b, and 80c. In such a structure, each pixel can include a light-emitting layer for its particular wavelength, e.g. red, green, and blue light-emitting layers.

Tuned multicolor OLED device 65 includes a color change media 25a and 25b, as described above, disposed over semitransparent reflector 30. Color change media 25a and 25b will emit light in all directions, including back into pixels 80a and 80b, respectively. To prevent this, dielectric stacks 75a and 75b as described above can optionally be disposed between color change media 25a and 25b, respectively, and semitransparent reflector 30. Dielectric stacks 75a and 75b must be relatively transparent to the particular wavelength enhanced on-axis by the microcavity structure, that is on-axis light 125a and 125b, respectively. The properties of the dielectric stack will therefore depend on the particular wavelength of the pixel.

While not required, color filters 85a and 85b as described above can also be included. One or more of the pixels of tuned OLED device 65 can include different color filters, the properties of which will depend on the desired on-axis viewed color of the pixel. A black matrix (not shown) as known in the art can be located between or around the pixels or color filters to improve the contrast.

At least two different color pixels of tuned multicolor OLED device 65 include a microcavity structure and a color change medium, e.g. pixels 80a and 80b. Other different color pixels (e.g. 80c) can be a variety of structures, including a microcavity structure with a color change medium, a microcavity structure without a color change medium (as shown in FIG. 4), or a non-microcavity structure. Any of these can optionally include a color filter or a dielectric stack or both.

Tuned multicolor OLED device 65 is an active matrix device with active matrix circuitry 210. The active matrix circuitry 210 is formed over substrate 20. Active matrix circuitry 210 includes a first thin film transistor (TFT) comprised of a semiconductor active layer 211, a gate dielectric 212, a gate conductor 213, a first insulating layer 214, and a second insulating layer 217. Active matrix circuitry 210 further includes one signal line 216 that carries the luminance signal and one power line 215 to supply power to the transistor. Methods of fabricating the TFT circuitry are well known in the art. While only a single transistor, signal line, and power line are shown for each pixel, typically, each pixel also has a second transistor (not shown) as well as a capacitor (not shown) and additional select lines (not shown). Many types of circuits having different numbers and configurations of circuit components are known in the art, and it is understood that a wide variety of these circuits will work with this invention. Examples of active matrix configurations include U.S. Pat. Nos. 5,550,066, 6,281,634, and 6,501,466. While the TFTs shown are fabricated with a thin film semiconductor active layer 211, it is understood that with semiconducting substrates, substrate 20 can actually serve this function. FIG. 4 shows a top gate structure, that is, where the gate conductor 213 and the gate dielectric 212 are above the semiconductor active layer 211. However, it is also known in the art that TFTs with an inverse structure known as bottom gate can be used to drive organic EL devices.

An interpixel dielectric layer 160, as described in U.S. Pat. No. 6,246,179, can be used to cover the edges of the transparent or semitransparent electrodes (e.g. reflector layer 90c) to prevent shorts or strong electric fields in this area. The interpixel dielectric layer 160 can also cover the transparent cavity-spacer layer (e.g. 35a) as shown if the transparent cavity-spacer layer is conductive or forms part of the electrode. While use of the interpixel dielectric layer 160 is preferred, it is not required for successful implementation of the present invention.

Alternate embodiments wherein tuned multicolor OLED device 65 is a passive matrix device and does not have active matrix circuitry can be applied to the present invention.

Pixel 80a functions as a microcavity structure wherein light emitted by light-emitting layer 50 is reflected by reflector layer 90a and a portion of light (typically between 25 and 75%) is reflected by semitransparent reflector 30. This leads to an enhancement of on-axis light 125a emitted by pixel 80a through semitransparent reflector 30 wherein certain wavelengths of on-axis light 125a will be enhanced as described above. The thickness of organic layers 100 optimized for emission is not necessarily of the proper dimensions to provide the desired wavelength of light 125a, and it can be desirable to further include transparent cavity-spacer layer 35a to obtain the desired dimensions. Transparent cavity-spacer layer 35a is formed above reflector layer 90a. The thickness of transparent cavity-spacer layer 35a, refractive index of transparent cavity-spacer layer 35a, or both, are adjusted in conjunction with the thickness and refractive index of organic layers 100 of tuned OLED device 65 in order to tune the microcavity structure to resonate at the wavelength for the desired color of light for pixel 80a. When two or more pixels include transparent cavity-spacer layers, the thickness of the transparent cavity-spacer layer, refractive index of the transparent cavity-spacer layer, or both, are separately adjusted for each different color pixel so that the transparent cavity-spacer layer can vary in different pixels (e.g. transparent cavity-spacer layers 35a and 35b in pixels 80a and 80b, respectively) or can be left out of some pixels (e.g. pixel 80c, which has no transparent cavity-spacer layer over reflector layer 90c).

While transparent cavity-spacer layers 35a and 35b are shown here as being between reflector layers 90a and 90b, respectively, and organic layers 100, in alternate embodiments transparent cavity-spacer layers 35a and 35b can be formed between organic layers 100 and semitransparent reflector 30.

In another alternate embodiment wherein one or more of organic layers 100 are not common to all pixels but are instead separately patterned for at least one pixel, the transparent cavity-spacer layers can be limited and the microcavity structure for the color-gamut-defining pixels can be tuned by separately tuning the thickness, refractive index, or both of one or more of organic layers 100 for each pixel.

The invention has been described in detail with particular reference to certain preferred embodiments thereof, but it will be understood that variations and modifications can be effected within the spirit and scope of the invention.

PARTS LIST

| | |
|---|---|
| 10 | tuned OLED device |
| 15 | tuned OLED device |
| 20 | substrate |
| 25 | color change medium |
| 25a | color change medium |
| 25b | color change medium |
| 30 | semitransparent reflector/electrode |
| 35 | transparent cavity-spacer layer |
| 35a | transparent cavity-spacer layer |
| 35b | transparent cavity-spacer layer |
| 40 | hole-injecting layer |
| 45 | hole-transporting layer |
| 50 | light-emitting layer |
| 55 | electron-transporting layer |
| 60 | electron-injecting layer |
| 65 | tuned multicolor OLED device |
| 70 | microcavity structure |
| 75 | dielectric stack |
| 75a | dielectric stack |
| 75b | dielectric stack |
| 80a | pixel |
| 80b | pixel |
| 80c | pixel |
| 85 | color filter |
| 85a | color filter |
| 85b | color filter |
| 90 | reflector layer/electrode |
| 90a | reflector layer |
| 90b | reflector layer |
| 90c | reflector layer |
| 100 | organic layers |
| 105 | light |
| 110 | reflected light |
| 115 | light |
| 120 | partially reflected light |
| 125 | partially transmitted on-axis light |
| 125a | on-axis light |
| 125b | on-axis light |
| 125c | on-axis light |
| 130 | partially reflected light |
| 135 | light |
| 140 | partially transmitted off-axis light |
| 150 | converted light |
| 160 | interpixel dielectric layer |
| 170 | spectrum |
| 175 | particular wavelength |
| 180 | particular wavelength |
| 185 | particular wavelength |
| 210 | active matrix circuitry |
| 211 | semiconductor active layer |
| 212 | gate dielectric |
| 213 | gate conductor |
| 214 | first insulating layer |
| 215 | power line |
| 216 | signal line |
| 217 | second insulating layer |

The invention claimed is:

1. A tuned OLED device, comprising:
   a) a tuned microcavity structure including a light-emitting layer for producing light, a semitransparent reflector, and a reflector layer disposed on opposite sides of the light-emitting layer, the tuned microcavity structure enhancing on-axis light produced from the light-emitting layer in at least one particular wavelength to produce a desired on-axis viewed color while not substantially enhancing on-axis other wavelengths of such light; and
   b) a layer including a color change medium which is responsive to wavelengths of light shorter than the particular wavelength by absorbing such shorter wavelengths of light and emitting light corresponding in color to the particular wavelength, thereby improving the color of the light produced by the OLED device when viewed in an off-axis direction.

2. The tuned OLED device of claim 1 wherein the light-emitting layer produces broadband wavelength light.

3. The tuned OLED device of claim 1 wherein the particular wavelength of on-axis light is in the red, green, or blue portions of the spectrum.

4. The tuned OLED device of claim 1 wherein the color change medium layer is disposed over the semitransparent reflector.

5. The tuned OLED device of claim 4 further including a dielectric stack disposed between the color change medium layer and the semitransparent reflector.

6. The tuned OLED device of claim 1 wherein the reflector also functions as an electrode.

7. The device of claim 1 wherein the semitransparent reflector also functions as an electrode.

8. The tuned OLED device of claim 1 wherein the device is a passive matrix device.

9. The tuned OLED device of claim 1 wherein the device is an active matrix device.

10. The tuned OLED device of claim 1 wherein the microcavity structure further includes a transparent cavity-spacer layer.

11. The tuned OLED device of claim 10 wherein the thickness of the transparent cavity-spacer layer, refractive index of the transparent cavity-spacer layer, or both, are adjusted in conjunction with the thickness and refractive index of the layers of the tuned OLED device to tune the microcavity structure to the desired color.

12. The tuned OLED device of claim 1 wherein the device is bottom-emitting.

13. The tuned OLED device of claim 1 wherein the device is top-emitting.

14. The tuned OLED device of claim 1 further including a color filter.

15. A tuned multicolor OLED device having an array of different color pixels wherein at least two of such different color pixels comprise:
   a) common light-emitting layer for each of the at least two such different color pixels that produces light having at least two different particular wavelengths corresponding to the two different colors;
   b) two different tuned microcavity structures, wherein each tuned microcavity structure includes a common light-emitting layer for producing light, a semitransparent reflector, and a reflector layer disposed on opposite sides of the light-emitting layer, each tuned microcavity structure enhances one of the particular wavelengths to provide on-axis light having the desired on-axis viewed color while not substantially enhancing other wavelengths of such light in an on-axis direction; and c) at least one color change medium associated with one of the different tuned microcavity structures which is responsive to wavelength of light shorter than the particular wavelength of the associated microcavity structure by absorbing such shorter wavelengths of light and emitting light corresponding in color to the desired particular wavelength, thereby improving the color of the light produced by the associated microcavity structure when viewed in an off-axis direction.

16. The tuned OLED device of claim 15 wherein the common light-emitting layer produces broadband wavelength light.

17. The tuned OLED device of claim 15 wherein the particular wavelengths of on-axis light are in the red, green, or blue portions of the spectrum.

18. The tuned OLED device of claim 15 wherein the color change medium layer is disposed over the semitransparent reflector.

19. The tuned OLED device of claim 18 further including a dielectric stack disposed between the color change medium layer and the semitransparent reflector.

20. The tuned OLED device of claim 15 wherein the reflector also functions as an electrode for at least one of the pixels.

21. The tuned OLED device of claim 15 wherein the semitransparent reflector also functions as an electrode for one or more of the pixels.

22. The tuned OLED device of claim 15 wherein the device is a passive matrix device.

23. The OLED device of claim 15 wherein the device is an active matrix device.

24. The tuned OLED device of claim 15 wherein at least one pixel further includes a transparent cavity-spacer layer.

25. The tuned OLED device of claim 24 wherein the thickness of the transparent cavity-spacer layer, refractive index of the transparent cavity-spacer layer, or both, are separately adjusted for each different color pixel in conjunction with the thickness and refractive index of the layers of the tuned OLED device to tune the microcavity structure to the desired colors.

* * * * *